United States Patent
Kamatani et al.

(10) Patent No.: US 6,946,207 B2
(45) Date of Patent: Sep. 20, 2005

(54) ELECTROCONDUCTIVE DEVICE, ORGANIC ELECTROLUMINESCENCE DEVICE USING THE DEVICE AND PROCESS FOR PRODUCING THE ELECTROCONDUCTIVE DEVICE

(75) Inventors: Jun Kamatani, Kawasaki (JP); Hidemasa Mizutani, Sagamihara (JP); Shinjiro Okada, Isehara (JP); Akira Tsuboyama, Sagamihara (JP); Takao Takiguchi, Tokyo (JP); Takashi Moriyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 210 days.

(21) Appl. No.: 09/963,441

(22) Filed: Sep. 27, 2001

(65) Prior Publication Data

US 2002/0135292 A1 Sep. 26, 2002

(30) Foreign Application Priority Data

Sep. 29, 2000 (JP) .......................................... 2000-298025
Sep. 20, 2001 (JP) .......................................... 2001-286040

(51) Int. Cl.$^7$ .......................... H05B 33/12; C09K 11/00
(52) U.S. Cl. .......................... 428/690; 428/917; 252/40; 252/301.16; 313/483; 313/504; 313/506
(58) Field of Search ................................ 428/690, 917; 313/504, 506, 483; 252/301.16; 257/40

(56) References Cited

U.S. PATENT DOCUMENTS

| | | | | | |
|---|---|---|---|---|---|
| 5,540,999 | A | * | 7/1996 | Yamamoto et al. | 428/411.1 |
| 6,249,085 | B1 | * | 6/2001 | Arai | 313/506 |
| 6,277,504 | B1 | * | 8/2001 | Koch et al. | 428/690 |
| 6,376,107 | B1 | * | 4/2002 | Heuer et al. | 428/690 |
| 6,572,985 | B2 | * | 6/2003 | Xie | 428/690 |

FOREIGN PATENT DOCUMENTS

JP  2001-167887  *  6/2001

* cited by examiner

*Primary Examiner*—Rena Dye
*Assistant Examiner*—Camie Thompson
(74) *Attorney, Agent, or Firm*—Fitzpatrick, Cella, Harper & Scinto

(57) ABSTRACT

An electroconductive device includes a pair of oppositely disposed electrodes, a luminescence layer and an electroconductive layer disposed between the electrodes. The electroconductive layer includes a mixture of a plurality of organic compounds which are mutually structural isomers and include a major component and a minor component. The mixture contains the major and minor components in a (major component/minor component) ratio of 1/1 to 9/1. When the electroconductive layer is used as a carrier injection or transport layer, preferably an electron injection layer, a resultant electroluminescence (EL) device exhibits a high luminescence efficiency.

9 Claims, 3 Drawing Sheets

ELECTROCONDUCTIVE DEVICE, ORGANIC ELECTROLUMINESCENCE DEVICE USING THE DEVICE AND PROCESS FOR PRODUCING THE ELECTROCONDUCTIVE DEVICE

FIELD OF THE INVENTION AND RELATED ARAT

The present invention relates to an organic electroluminescence (EL) device for use in, e.g., flat panel displays, projection displays, and printers; an electroconductive device used for the EL device; and a process for producing the electroconductive device.

Since C. W. Tang et al substantiated in 1987 that it is possible to effect high-brightness luminescence under application of a low DC voltage by utilizing a lamination structure comprising a film of fluorescent metal chelate complex and a diamine-based molecular film, an applied study on an organic electroluminescence (EL) device as a luminescence device with high-speed responsiveness and high efficiency has been extensively conducted. The organic EL device is a self-light emitting device of a carrier injection type using luminescence occurring at the time of re-combination of electrons and holes reached to a luminescent layer.

FIG. 6 shows a structure of an ordinary organic EL device.

Referring to FIG. 6, the EL device includes a transparent substrate 21, and thereon layers of a transparent electrode 22, a hole transporting layer 23, a luminescent layer 24 and a metal electrode 25 are successively disposed in this order. Between the metal electrode 25 (as a cathode) and the transparent electrode 22 (as an anode) for taking out emitted light, organic compound layers 20 comprising the luminescence layer 24 and the hole transporting layer 23 are formed and disposed each in a thickness of ca. several hundred Å. Examples of the cathode metal electrode 25 may include a metal or an alloy having a smaller work function, such as aluminum, aluminum-lithium alloy and magnesium-silver alloy. Examples of the anode transparent electrode 22 may include an electroconductive material having a larger work function, such as ITO (indium tin oxide). The organic compound layer 20 in this structure (FIG. 6) has a two-layer structure comprising the luminescence layer 24 and the hole transporting layer 23.

FIG. 7 shows another structure of an ordinary organic EL device.

Referring to FIG. 7, the EL device includes a transparent substrate 21 on which a transparent electrode 22 (anode), a hole transporting layer 23, a luminescence layer 24, an electron transporting layer 31 and a metal electrode 25 (cathode) are sequentially disposed in this order. In this case, an organic compound layer 20 has a three-layer structure comprising the hole transporting layer 23, the luminescence layer 24 and the electron transporting layer 31.

Generally, the hole transporting layer (23 in FIGS. 6 and 7) has a function of efficiently injecting holes from the anode (transparent electrode 22) into the luminescence layer (24). On the other hand, the electron transporting layer (31 in FIG. 7) generally has a function of efficiently injecting electrons from the cathode (metal electrode 25) into the luminescence layer (24).

These hole transporting and electron transporting layers (23 and 31) also have an electron (carrier) blocking function and a hole (carrier) blocking function, respectively, thus enhancing a resultant luminescence efficiency.

For these carrier (hole and electron) transporting layers (23 and 31), it is important to exhibit a sufficient charge (carrier) transporting ability, particularly a carrier mobility.

Accordingly, if the carrier mobility in the carrier transporting layer is increased, more carriers can be injected into the luminescence layer 24 to enhance the luminescence efficiency. In addition, the higher mobility is also effective in increasing a thickness (e.g., ca. 1 μm) of the carrier transporting layer (generally, several hundred Å-thick). As a result, it becomes possible to prevent an occurrence of short circuit between the pair of electrodes (anode and cathode) and improve a productivity.

For this reason, at present, a compound (material) for the carrier transport layer has been extensively developed in order to achieve a high luminescence efficiency of the organic EL device.

In order to obtain a high electroconductivity by applying an electric field to a pair of electrodes between which an organic compound layer is disposed, it is necessary to provide a good carrier (electron/hole) injection performance from the electrodes and a high carrier mobility.

Incidentally, although hole injection/transport materials exhibiting relatively good performances have been proposed, an electron injection/transport material exhibiting a sufficient characteristic has not been found as yet.

SUMMARY OF THE INVENTION

In view of the above-mentioned problem, an object of the present invention is to provide an electroconductive device using a carrier injection and/or transport layer comprising a material suitable for efficiently injecting and/or transporting carriers (holes or electrons).

Another object of the present invention is to provide an organic electroluminescence (EL) device including the electroconductive device and having a high luminescence efficiency and a high reliability.

A further object of the present invention is to provide a process for producing the electroconductive device.

According to the present invention, there is provided an electroconductive device, comprising: a pair of oppositely disposed electrodes, and a luminescence layer and an electroconductive layer disposed between the electrodes, wherein
    the electroconductive layer comprises a mixture of a plurality of organic compounds which are mutually structural isomers and include a major component and a minor component, the mixture comprising the major and minor components in a (major component)/(minor component) ratio of 1/1 to 9/1.

According to the present invention, there is also provided an electroluminescence (EL) device including the above-mentioned electroconductive device wherein the electroconductive layer is used as a carrier injection layer and/or a carrier transport layer.

According to the present invention, there is further provided a process for producing the above-mentioned electroconductive device, comprising:
    a step of forming the above-mentioned electroconductive layer between the pair of electrodes.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
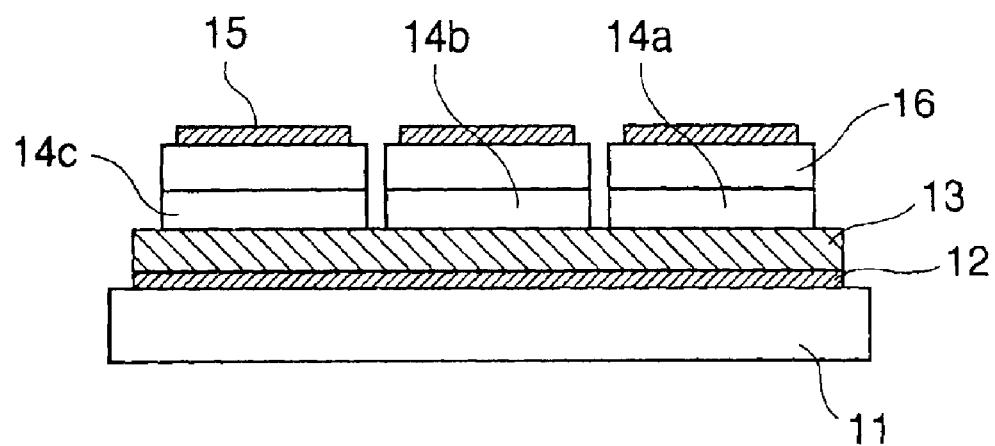
FIG. 1 is a schematic sectional view of an embodiment of an electroconductive device (organic EL device) prepared in Example 2 (appearing hereinafter) according to the present invention.

The electroconductive device according to the present invention is characterized in that an electroconductive layer disposed between a pair of electrodes is formed by using a mixture of a plurality of organic compounds which are mutually structural isomers and include a major component and a minor component (hereinafter, referred to as a "structural isomer mixture"). The structural isomer mixture comprises the major and minor component in (major component)/(minor component) ratio of 1/1 to 9/1, preferably 1/1 to 5/1.

The organic EL device according to the present invention using the electroconductive layer as a carrier injection layer and/or a carrier transport layer, preferably as an electron injection layer and/or an electron transport layer.

Herein, the structural isomers refer to compounds having an identical ring structure and an identical rational formula but having (molecular) structures different in the manner in which their atoms are linked.

A compound molecule having at least one ring structure has a planar molecular structure by nature, thus being liable to be crystallized in the case of a single compound (free from structural isomer).

On the other hand, we have found that it is possible to stably form an amorphous structure by using a structural isomer mixture, particularly a mixture of low-molecular compounds each having such a ring structure that a plurality of rings are connected via a single bond.

In the present invention, by using the structural isomer mixture having such a stabilized amorphous structure, it becomes possible to form an electroconductive layer exhibiting a high carrier injection and/or transport performance. Further, by using the electroconductive layer as a charge injection and/or transport layer, it is possible to provide an organic EL device with a high luminescence efficiency.

Incidentally, with respect to a luminescent layer, it has been suggested that the luminescent layer containing an aminoquinoline complex having a facial-rich stereostructure provides better performances (Japanese Laid-Open Patent Application (JP-A) No. 4-85388).

According to the present invention, by using the structural isomer mixture in the electroconductive layer (as the carrier injection and/or transfer layer), the resultant EL device exhibits an excellent luminescent characteristic.

In the present invention, the organic compounds constituting the structural isomer mixture may preferably be represented by the following formula (1):

$$(R-X)_n-Ar-(X'-R')_m \qquad (1),$$

wherein Ar denotes a connected ring structure comprising two single rings connected with each other via a single bond or two fused rings connected with each other via a single bond; X and X' independently denote a single bond, —O—, —S—, —OOC— or —COO—; R and R' independently denote —H, —F or a linear or branched alkyl group having 1–20 carbon atoms capable of including one methylene group which can be replaced with —O—, —S—, —CH=CH— or —C≡C—; and m and n are an integer of 1–8, with the proviso that R and R' cannot be —H at the same time when X and X' are a single bond.

In the formula (1), Ar may preferably be a connected ring structure comprising two fused rings connected with each other via a single bond, wherein each of said two fused rings comprises 2–5 rings. Further, Ar in the formula (1) may preferably be a connected ring structure represented by any one of the following formulas (a) to (n):

(a)

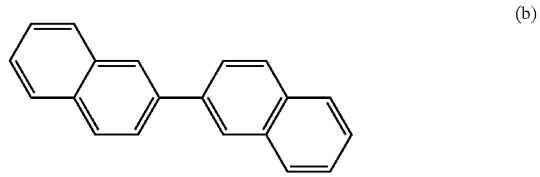
(b)

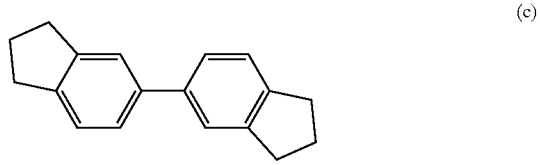
(c)

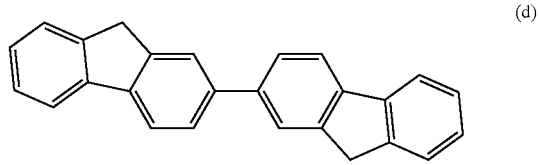
(d)

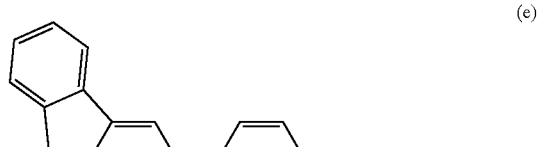
(e)

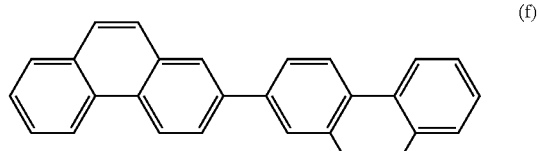
(f)

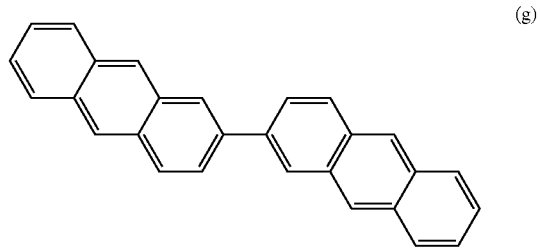
(g)

-continued

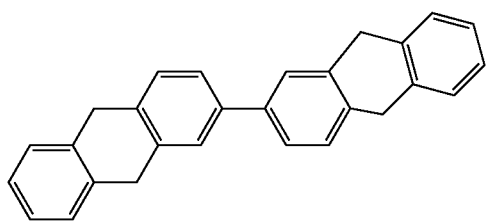
(h)

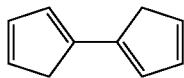
(i)

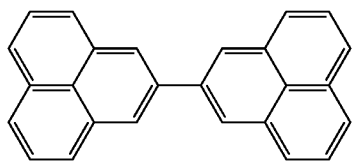
(j)

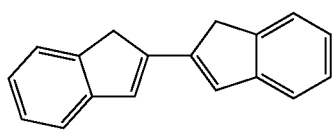
(k)

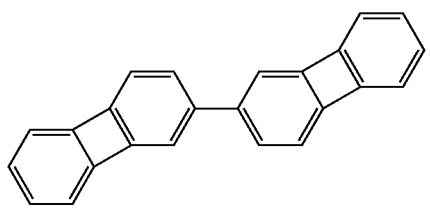
(l)

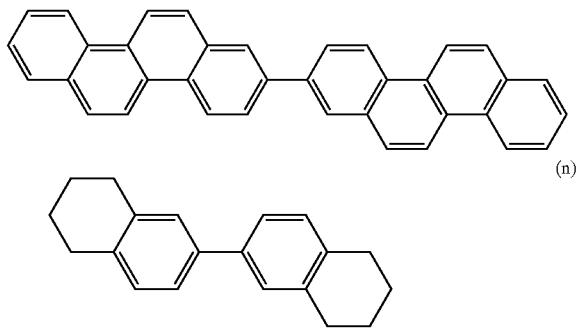
(m)

(n)

wherein CH is optionally substituted with N or NH, and $CH_2$ is optionally substituted with S or O.

Ar in the formula (1) may preferably be a connected ring structure represented by the following formula (2):

A—B  (2), wherein A and B independently denote any one of phenyl-diyl, pyridine-diyl, pyrazine-diyl, pyrimidine-diyl, pyridazine-diyl, indene-diyl, indolizine-diyl, isoindole-diyl, indole-diyl, purine-diyl, naphthalene-diyl, quinoline-diyl, isoquinoline-diyl, quinoxaline-diyl, 1,5-naphthyridine-diyl, 1,6-naphthyridine-diyl, 1,7-naphtharidine-diyl, 1,8-naphthyridine-diyl, quinazoline-diyl, cinnoline-diyl, pyrido[2,3-b]pyrazine-diyl, pyrazino[2,3-b]pyrazine-diyl, pteridine-diyl, biphenylene-diyl, fluorene-diyl, carbazole-diyl, thianthrene-diyl, phenalene-diyl, phenanthridine-diyl, phenanthrene-diyl, anthracene-diyl, chrysene-diyl, acridine-diyl, perimidine-diyl, phenanthroline-diyl, phenazine-diyl, phenothiazine-diyl, phenoxathin-diyl, indan-diyl, coumaran-diyl, phthalan-diyl, chroman-diyl, isochroman-diyl, thiachroman-diyl, isothiachroman-diyl, and thiaxanthene-diyl.

In the formula (2), A may preferably be quinoxaline-diyl.

In the formula (1) and (2), R=R', X=X', m=n=1 are satisfied in the formula (1), and A=B may preferably be satisfied to form a symmetric structure having a center of symmetry.

The organic compounds used for constituting the structural isomer mixture in the present invention may desirably be selected based on the following molecular design factors (1) to (3).

(1) Lowering in LUMO (Lowest Unoccupied Molecular Orbital) Level

An electron transport is effected by hopping conduction on LUMO of organic compound molecules. Accordingly, it is important to improve electron injection from an electrode to LUMO. Generally, in view of chemical stability of the electrode, it is difficult to decrease a work function of the electrode. As a result, a key feature for the improved electron injection is how to lower the LUMO level of organic compounds used.

From the above viewpoint, we have calculated HOMO (highest occupied molecular orbital) levels and LUMO levels of several ring structures (capable of constituting the organic compounds used in the present invention) according to molecular orbital method in order to expect the LUMO level of the organic compounds. As the molecular orbital method, in the present invention, a semiempirical molecular orbital method (the AM1 method) is used.

The results are as follows.

| | | HOMO | LUMO |
|---|---|---|---|
| quinoline | | −9.2 | −0.47 |
| isoquinoline | | −9.0 | −0.56 |
| quinoxaline | | −9.6 | −0.68 |
| [1,5]naphthyridine | | −9.7 | −0.67 |
| [1,6]naphthyridine | | −9.5 | −0.77 |

-continued

| | | HOMO | LUMO |
|---|---|---|---|
| 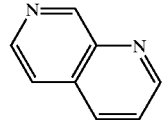 | [1,7]naphthyridine | −9.5 | −0.76 |
| 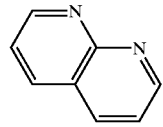 | [1,8]naphthyridine | −9.8 | −0.71 |
| 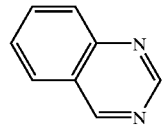 | quinazoline | −9.5 | −0.77 |
| 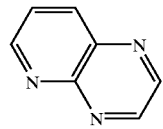 | pyrido[2,3-b]pyrazine | −10.0 | −0.93 |
| 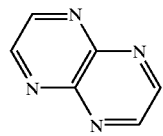 | pyradino[2,3-b]pyrazine | −9.9 | −1.21 |
| 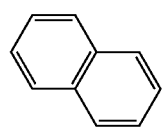 | naphtyalene | −8.7 | −0.27 |

As shown above, compared with naphthalene, naphthalene skeleton having 1–4 nitrogen atoms (substituted for corresponding CH group(s) of naphthalene) can lower the LUMO level of naphthalene.

Accordingly, by using such heterocyclic fused ring structure as a skeleton of organic compound, a resultant electron injection performance from an electrode is expected to be improved based on lowering in LUMO level.

(2) Symmetry of Molecular Structure

As described in (1), the electroconductivity of liquid crystal compound is based on the hopping conduction, which varies largely depending on a magnitude of overlap integral of π electron cloud between adjacent molecules. It is important to increase the overlap integral of the π electron cloud in order to improve an electron conductivity. For the electron conduction, it is effective to impart a (molecular-structural) symmetry to the organic compound molecules so as to dispose their π electron skeletons close to each other, thus increasing the overlap integral of π electron cloud. As a result, a mobility of electron is improved to provide an enhanced electroconductivity.

Even if a complete symmetry of molecular structure is not ensured, the above advantages are retained as far as organic compound molecules have a similar skeleton structure such that both of terminal chains have an almost equal carbon number.

Accordingly, in the present invention, the organic compounds may preferably have a symmetric structure having a center of symmetry by designing molecular structure so as to satisfy R=R', X=X', m=n=1 and A=B (in A—B as Ar) in the above-mentioned formulas (1) and (2).

(3) Suppression of Crystallization in the Presence of Structural Isomers

The increase in overlap integral of π electron cloud between adjacent molecules leads to an increase in regularity of mutually adjacent molecules, thus resulting in a high crystallinity thereof.

In order to prevent an occurrence of such a crystallization, it is expected that the crystallinity of the structural isomer mixture can be lowered by mixing a plurality of organic compounds having different substituents outside the π electron clouds, thus providing an amorphous property to increase an electroconductivity.

Accordingly, the structural isomer mixture constituting the electroconductive layer used in the present invention may desirably be placed in an amorphous state.

In the present invention, the above-described three molecular design factors (1), (2) and (3) are not necessarily fulfilled at the same time.

Based on the above molecular design factors, we have found that it is possible to realize a luminescence device with a high luminescence efficiency by using the structural isomer mixture comprising a plurality of organic compounds of the formula (1) (preferably formula (2)) in a carrier injection and/or transport layer of an organic EL device.

Particularly, when an electron injection layer is formed by using the structural isomer mixture comprising such organic compounds based on the above molecular design factors, it becomes possible to considerably improve an electron injection performance.

The luminescence device (electroconductive device) with a high luminescence efficiency can be applied to products required to effect energy saving or provide a high luminance (brightness), such as a display apparatus, an illumination apparatus, a light source for a printer, and a backlight for a liquid crystal display apparatus. More specifically, as the display apparatus, it is possible to provide a flat panel display excellent in energy saving performance, visibility and weight reduction. As the light source for a printer, it is possible to replace a laser light source of a laser beam printer widely used at present with the electroconductive device of the present invention. Image formation may be performed by disposing independently addressable devices in array and subjecting a photosensitive drum to a desired exposure to light. By using the electroconductive device of the present invention, it is possible to remarkably reduce an apparatus size (volume). With respect to the illumination apparatus and the backlight, it is possible to expect an energy saving performance by the use of the electroconductive device of the present invention.

Hereinbelow, specific but non-exhaustive examples of the organic compounds of the formula (2) constituting the structural isomer mixture used in the electroconductive device (or EL device) of the present invention will be enumerated in the following Tables 5–15. Symbols $a_1$ to $a_{33}$ used for specifying a ring structure for liquid crystal compounds shown in Tables 5–15 have specific skeletons (ring structures) shown in the following Tables 1–4.

TABLE 1

| Symbol | Name | Formula |
| --- | --- | --- |
| a₁ | quinoxaline-diyl | 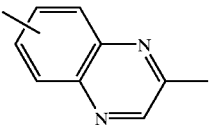 |
| a₂ | | 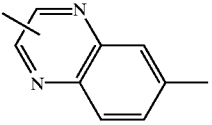 |
| a₃ | quinoline-diyl | 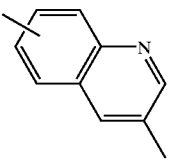 |
| a₄ | | 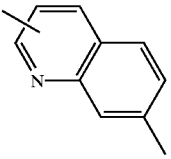 |
| a₅ | isoquinoline-diyl | 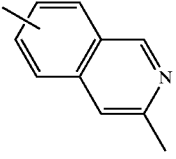 |
| a₆ | | 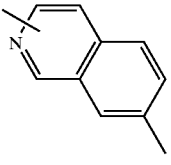 |
| a₇ | quinoline-diyl | 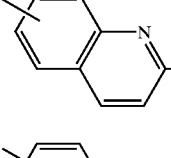 |
| a₈ | | 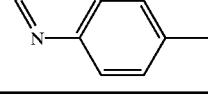 |

TABLE 2

| Symbol | Name | Formula |
| --- | --- | --- |
| a₉ | [1,5]naphthyridine-diyl | 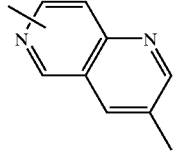 |

TABLE 2-continued

| Symbol | Name | Formula |
| --- | --- | --- |
| a₁₀ | [1,6]naphthyridine-diyl | 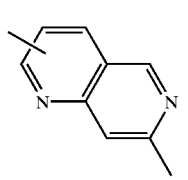 |
| a₁₁ | | 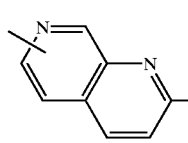 |
| a₁₂ | [1,7]naphthyridine-diyl | 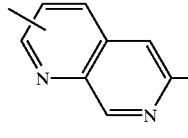 |
| a₁₃ | | 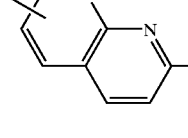 |
| a₁₄ | [1,8]naphthyridine-diyl | 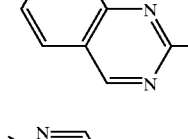 |
| a₁₅ | quinazoline-diyl | 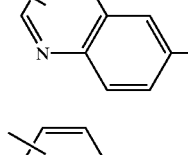 |
| a₁₆ | | 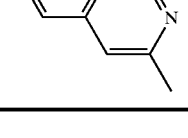 |
| a₁₇ | cinnoline-diyl | 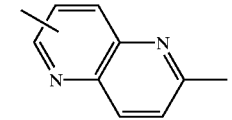 |

TABLE 3

| Symbol | Name | Formula |
| --- | --- | --- |
| a₁₈ | cinnoline-diyl | 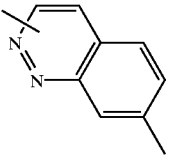 |

TABLE 3-continued
| Symbol | Name | Formula |
|---|---|---|
| a19 | pyrido[2,3-b]pyridine-diyl | 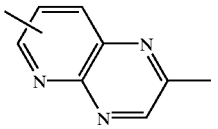 |
| a20 | | 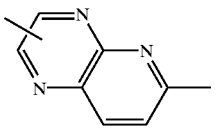 |
| a21 | pyrido[2,3-b]pyrazine-diyl | 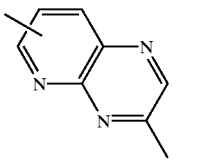 |
| a22 | | 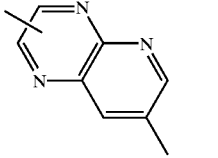 |
| a23 | pyrazino[2,3-b]pyrazine-diyl | 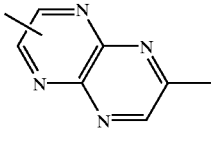 |
| a24 | pteridine-diyl | 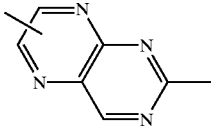 |
| a25 | | 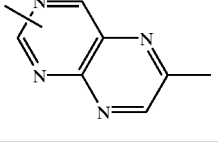 |
TABLE 4
| Symbol | Name | Formula |
|---|---|---|
| a26 | naphthalene-2,6-diyl | 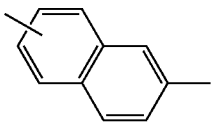 |
TABLE 4-continued
| Symbol | Name | Formula |
|---|---|---|
| a27 | chrycene-2,6-diyl | 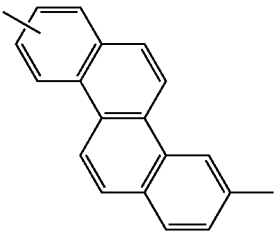 |
| a28 | phenazine-diyl | 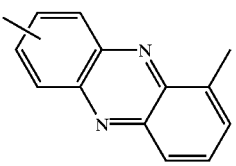 |
| a29 | isochroman-diyl | 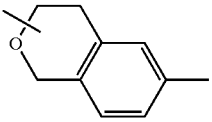 |
| a30 | phenoxathiin-diyl | 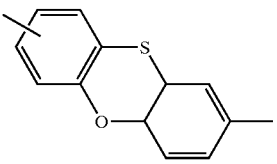 |
| a31 | phenanthroline-diyl | 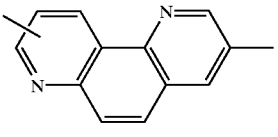 |
| a32 | pyrazine-diyl | 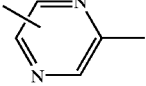 |
| a33 | [1,8]naphthyridine-diyl | 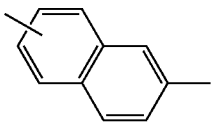 |

TABLE 5

| No. | R | X | A | B | X' | R' |
|---|---|---|---|---|---|---|
| 1 | $CH_3$ | O | $a_1$ | $a_1$ | — | $C_7H_{15}$ |
| 2 | $C_8H_{17}$ | — | $a_1$ | $a_1$ | — | $C_{11}H_{23}$ |
| 3 | F | — | $a_1$ | $a_1$ | — | $C_{20}H_{41}$ |
| 4 | H | — | $a_1$ | $a_1$ | O | $OC_9H_{19}$ |
| 5 | $C_4H_9$ | O | $a_1$ | $a_1$ | — | $C_8H_{17}$ |
| 6 | $C_{12}H_{25}$ | O | $a_1$ | $a_1$ | — | $C_{10}H_{21}$ |
| 7 | $C_6H_{13}$ | O | $a_1$ | $a_1$ | O | $C_6H_{13}$ |
| 8 | $C_8H_{17}$ | O | $a_1$ | $a_1$ | O | $C_8H_{17}$ |
| 9 | $C_{11}H_{23}$ | O | $a_1$ | $a_1$ | O | $C_{11}H_{23}$ |
| 10 | $C_4H_9OCH(CH_3)CH_2(CH_2)_4$ | O | $a_1$ | $a_1$ | O | $(CH_2)_4CH_2CH(CH_3)OC_4H_9$ |
| 11 | $C_9H_{19}$ | O | $a_1$ | $a_1$ | O | $(CH_2)_5OC_3H_7$ |
| 12 | $C_5H_{11}OCH_{23}$ | O | $a_1$ | $a_1$ | O | $(CH_2)_3OC_5H_{11}$ |
| 13 | $C_5H_{11}$ | O | $a_1$ | $a_1$ | O | $C{\equiv}CC_6H_{13}$ |
| 14 | $C_5H_{11}CH{=}CH$ | O | $a_1$ | $a_1$ | O | $CH{=}CHC_5H_{11}$ |
| 15 | $C_{10}H_{21}$ | S | $a_1$ | $a_1$ | S | $C_{10}H_{21}$ |
| 16 | $C_3H_7$ | — | $a_1$ | $a_1$ | — | $C_3H_7$ |
| 17 | $C_4H_9$ | — | $a_1$ | $a_1$ | — | $C_4H_9$ |
| 18 | $C_5H_{11}$ | — | $a_1$ | $a_1$ | — | $C_5H_{11}$ |
| 19 | $C_6H_{13}$ | — | $a_1$ | $a_1$ | — | $C_6H_{13}$ |
| 20 | $C_7H_{15}$ | — | $a_1$ | $a_1$ | — | $C_7H_{15}$ |

TABLE 6

| No. | R | X | A | B | X' | R' |
|---|---|---|---|---|---|---|
| 21 | $C_8H_{17}$ | — | $a_1$ | $a_1$ | — | $C_8H_{17}$ |
| 22 | $C_9H_{19}$ | — | $a_1$ | $a_1$ | — | $C_9H_{19}$ |
| 23 | $C_{10}H_{21}$ | — | $a_1$ | $a_1$ | — | $C_{10}H_{21}$ |
| 24 | $C_{11}H_{23}$ | — | $a_1$ | $a_1$ | — | $C_{11}H_{23}$ |
| 25 | $C_{12}H_{25}$ | — | $a_1$ | $a_1$ | — | $C_{12}H_{25}$ |
| 26 | $C_{18}H_{37}$ | — | $a_1$ | $a_1$ | — | $C_{18}H_{37}$ |
| 27 | $C_6H_{13}$ | — | $a_1$ | $a_1$ | — | $C_8H_{17}$ |
| 28 | $C_{11}H_{23}$ | — | $a_1$ | $a_1$ | — | $C_3H_7$ |
| 29 | $C_6H_{13}$ | COO | $a_1$ | $a_1$ | OOC | $C_6H_{13}$ |
| 30 | $C_5H_{11}$ | COO | $a_1$ | $a_1$ | COO | $C_{11}H_{23}$ |
| 31 | $C_2H_5CH(CH_3)CH_2(CH_2)_4$ | OOC | $a_1$ | $a_1$ | COO | $(CH_2)_5CH(CH_3)C_2H_5$ |
| 32 | H | — | $a_1$ | $a_{26}$ | O | $C_4H_9$ |
| 33 | $C_8H_{17}$ | — | $a_1$ | $a_{26}$ | O | $C_5H_{11}$ |
| 34 | $C_{11}H_{23}$ | — | $a_1$ | $a_{26}$ | O | $C_{10}H_{21}$ |
| 35 | $C_9H_{19}$ | O | $a_1$ | $a_{26}$ | O | $C_9H_{19}$ |
| 36 | $C_{15}H_{31}$ | O | $a_1$ | $a_{26}$ | O | $C_7H_{15}$ |
| 37 | $C_{13}H_{27}$ | — | $a_1$ | $a_{26}$ | — | $C_3H_7$ |
| 38 | $C_6H_{13}$ | — | $a_1$ | $a_{26}$ | — | $C_6H_{13}$ |
| 39 | $C_9H_{19}$ | — | $a_1$ | $a_{26}$ | — | $C_9H_{19}$ |
| 40 | $C_3H_7$ | O | $a_2$ | $a_2$ | O | $C_{14}H_{29}$ |

TABLE 7

| No. | R | X | A | B | X' | R' |
|---|---|---|---|---|---|---|
| 41 | $C_7H_{15}$ | — | $a_2$ | $a_2$ | — | $C_7H_{15}$ |
| 42 | $C_{12}H_{25}$ | — | $a_2$ | $a_2$ | — | $C_{18}H_{37}$ |
| 43 | H | — | $a_2$ | $a_{26}$ | O | $C_4H_9$ |
| 44 | $C_8H_{17}$ | — | $a_2$ | $a_{26}$ | — | $C_{11}H_{23}$ |
| 45 | $C_5H_{11}$ | — | $a_2$ | $a_{26}$ | O | $(CH_2)_5OC_6H_{13}$ |
| 46 | $C_2H_5$ | O | $a_3$ | $a_3$ | — | $C_8H_{17}$ |
| 47 | $C_6H_{13}$ | — | $a_3$ | $a_3$ | — | $C_6H_{13}$ |
| 48 | $C_7H_{15}$ | — | $a_3$ | $a_3$ | — | $C_7H_{15}$ |
| 49 | $C_8H_{17}$ | — | $a_3$ | $a_3$ | — | $C_8H_{17}$ |
| 50 | $C_{12}H_{25}$ | — | $a_3$ | $a_3$ | — | $C_{12}H_{25}$ |
| 51 | $C_9H_{19}$ | O | $a_3$ | $a_3$ | O | $C_5H_{11}$ |
| 52 | $C_{10}H_{21}$ | — | $a_3$ | $a_{26}$ | O | $C_4H_9$ |
| 53 | $C_5H_{11}$ | — | $a_3$ | $a_{26}$ | — | $C_5H_{11}$ |
| 54 | $C_8H_{17}$ | — | $a_4$ | $a_4$ | — | $C_8H_{17}$ |
| 55 | $C_3H_7$ | — | $a_4$ | $a_{26}$ | O | $C_{10}H_{21}$ |
| 56 | $C_7H_{15}$ | — | $a_5$ | $a_5$ | — | $C_6H_{13}$ |
| 57 | $C_5H_{11}$ | O | $a_5$ | $a_5$ | — | $C_5H_{11}$ |
| 58 | $C_3H_7$ | O | $a_5$ | $a_5$ | — | $C_{11}H_{23}$ |
| 59 | H | — | $a_5$ | $a_5$ | O | $C_{16}H_{33}$ |
| 60 | $C_9H_{19}$ | O | $a_5$ | $a_5$ | O | $C_7H_{15}$ |

TABLE 8

| No. | R | X | A | B | X' | R' |
|---|---|---|---|---|---|---|
| 61 | $C_6H_{13}$ | — | $a_5$ | $a_5$ | — | $C_6H_{13}$ |
| 62 | $C_7H_{15}$ | — | $a_5$ | $a_5$ | — | $C_7H_{15}$ |
| 63 | $C_8H_{17}$ | — | $a_5$ | $a_5$ | — | $C_8H_{17}$ |
| 64 | $C_{13}H_{27}$ | — | $a_5$ | $a_5$ | — | $C_5H_{11}$ |
| 65 | $C_{10}H_{21}$ | — | $a_5$ | $a_{26}$ | O | $(CH_2)_5C{\equiv}CCH_3$ |
| 66 | $C_4H_9$ | — | $a_5$ | $a_{26}$ | — | $C_9H_{19}$ |
| 67 | $C_5H_{11}$ | — | $a_5$ | $a_{26}$ | — | $C_5H_{11}$ |
| 68 | $C_6H_{13}$ | — | $a_6$ | $a_6$ | — | $C_6H_{13}$ |
| 69 | $C_{12}H_{25}$ | — | $a_6$ | $a_6$ | — | $C_{12}H_{25}$ |
| 70 | $C_9H_{19}$ | — | $a_6$ | $a_{26}$ | O | $C_3H_7$ |
| 71 | $C_{10}H_{21}$ | — | $a_6$ | $a_{26}$ | — | $C_{10}H_{21}$ |
| 72 | $C_3H_7$ | — | $a_7$ | $a_7$ | — | $C_3H_7$ |
| 73 | $C_{10}H_{21}$ | — | $a_7$ | $a_7$ | — | $C_4H_9$ |
| 74 | $C_{11}H_{23}$ | — | $a_7$ | $a_7$ | O | $(CH_2)_7CH(CH_3)_2$ |
| 75 | $C_{17}H_{35}$ | O | $a_7$ | $a_7$ | — | $C_8H_{17}$ |
| 76 | $C_7H_{15}$ | — | $a_7$ | $a_7$ | — | $C_7H_{15}$ |
| 77 | $C_8H_{17}$ | — | $a_7$ | $a_7$ | — | $C_8H_{17}$ |
| 78 | $C_9H_{19}$ | — | $a_7$ | $a_7$ | — | $C_9H_{19}$ |
| 79 | $C_{10}H_{21}$ | — | $a_7$ | $a_7$ | — | $C_{10}H_{21}$ |
| 80 | $C_{11}H_{23}$ | — | $a_7$ | $a_7$ | — | $C_3H_7$ |

TABLE 9

| No. | R | X | A | B | X' | R' |
|---|---|---|---|---|---|---|
| 81 | $C_7H_{15}$ | — | $a_7$ | $a_{26}$ | O | $CH_3$ |
| 82 | $C_7H_{15}$ | — | $a_7$ | $a_{26}$ | OOC | $C_4H_9$ |
| 83 | $C_8H_{17}$ | — | $a_7$ | $a_{26}$ | — | $C_8H_{17}$ |
| 84 | $C_7H_{15}$ | — | $a_8$ | $a_8$ | — | $C_7H_{15}$ |
| 85 | $C_8H_{17}$ | — | $a_8$ | $a_8$ | — | $C_8H_{17}$ |
| 86 | $C_{12}H_{25}$ | — | $a_8$ | $a_{26}$ | O | $C_5H_{11}$ |
| 87 | $C_{18}H_{37}$ | — | $a_8$ | $a_{26}$ | — | $C_4H_9$ |
| 88 | $C_7H_{15}$ | — | $a_9$ | $a_9$ | — | $C_7H_{15}$ |
| 89 | $C_8H_{17}$ | — | $a_9$ | $a_9$ | — | $C_8H_{17}$ |
| 90 | $C_9H_{19}$ | — | $a_9$ | $a_9$ | — | $C_9H_{19}$ |
| 91 | $C_4H_9$ | — | $a_9$ | $a_9$ | — | $C_4H_9$ |
| 92 | $C_{15}H_{31}$ | — | $a_9$ | $a_9$ | — | $C_{15}H_{31}$ |
| 93 | $C_5H_{11}$ | — | $a_9$ | $a_9$ | — | $C_8H_{17}$ |
| 94 | $C_{10}H_{21}$ | — | $a_9$ | $a_9$ | — | $C_6H_{13}$ |
| 95 | $C_6H_{13}$ | — | $a_9$ | $a_{26}$ | COO | $(CH_2)_3OC_3H_7$ |
| 96 | $C_9H_{19}$ | — | $a_9$ | $a_{26}$ | — | $C_7H_{15}$ |
| 97 | $C_7H_{15}$ | — | $a_{10}$ | $a_{10}$ | O | $C_6H_{13}$ |
| 98 | $C_7H_{15}$ | — | $a_{10}$ | $a_{10}$ | — | $C_7H_{15}$ |
| 99 | $C_{10}H_{21}$ | — | $a_{10}$ | $a_{10}$ | — | $C_{10}H_{21}$ |
| 100 | $C_5H_{11}$ | — | $a_{10}$ | $a_{26}$ | O | $C_{11}H_{23}$ |

TABLE 10

| No. | R | X | A | B | X' | R' |
|---|---|---|---|---|---|---|
| 101 | $C_8H_{17}$ | — | $a_{10}$ | $a_{26}$ | — | $C_{12}H_{25}$ |
| 102 | $C_8H_{17}$ | — | $a_{11}$ | $a_{11}$ | — | $C_8H_{17}$ |
| 103 | $C_9H_{19}$ | — | $a_{11}$ | $a_{11}$ | — | $C_9H_{19}$ |
| 104 | $C_3H_7$ | O | $a_{11}$ | $a_{11}$ | — | $C_8H_{17}$ |
| 105 | $C_{18}H_{37}$ | O | $a_{11}$ | $a_{26}$ | O | $C_2H_5$ |
| 106 | $C_6H_{13}$ | — | $a_{12}$ | $a_{12}$ | — | $C_6H_{13}$ |
| 107 | $C_9H_{19}$ | — | $a_{12}$ | $a_{12}$ | — | $C_9H_{19}$ |
| 108 | $C_{10}H_{21}$ | — | $a_{12}$ | $a_{12}$ | — | $C_{10}H_{21}$ |
| 109 | $C_{11}H_{23}$ | — | $a_{12}$ | $a_{12}$ | — | $C_{11}H_{23}$ |
| 110 | $C_{12}H_{25}$ | — | $a_{12}$ | $a_{12}$ | — | $C_{12}H_{25}$ |
| 111 | $C_7H_{15}$ | — | $a_{12}$ | $a_{26}$ | O | $C_5H_{11}$ |
| 112 | $C_{13}H_{27}$ | — | $a_{12}$ | $a_{26}$ | — | $C_{10}H_{21}$ |
| 113 | $C_4H_9$ | — | $a_{13}$ | $a_{13}$ | — | $C_4H_9$ |
| 114 | $C_9H_{19}$ | — | $a_{13}$ | $a_{13}$ | S | $C_8H_{17}$ |
| 115 | $C_5H_{11}$ | — | $a_{14}$ | $a_{14}$ | — | $C_5H_{11}$ |
| 116 | $C_7H_{15}$ | O | $a_{14}$ | $a_{14}$ | — | $C_9H_{19}$ |
| 117 | $C_{10}H_{21}$ | — | $a_{14}$ | $a_{33}$ | O | $(CH_2)_3OC_5H_{11}$ |
| 118 | $C_7H_{15}$ | — | $a_{14}$ | $a_{33}$ | — | $C_7H_{15}$ |
| 119 | $C_{12}H_{25}$ | — | $a_{14}$ | $a_{33}$ | — | $C_{12}H_{25}$ |
| 120 | $C_8H_{17}$ | — | $a_{14}$ | $a_{26}$ | — | $C_4H_9$ |

TABLE 11

| No. | R | X | A | B | X' | R' |
|---|---|---|---|---|---|---|
| 121 | $C_6H_{13}$ | — | $a_{14}$ | $a_{26}$ | — | $C_6H_{13}$ |
| 122 | $C_3H_7$ | — | $a_{33}$ | $a_{14}$ | — | $C_{15}H_{31}$ |
| 123 | $C_8H_{17}$ | — | $a_{33}$ | $a_{26}$ | O | $C_8H_{17}$ |
| 124 | $C_3H_7$ | O | $a_{15}$ | $a_{15}$ | — | $C_{10}H_{21}$ |
| 125 | $C_7H_{15}$ | — | $a_{15}$ | $a_{15}$ | — | $C_7H_{15}$ |
| 126 | $C_5H_{11}$ | — | $a_{15}$ | $a_{15}$ | O | $C_7H_{15}$ |
| 127 | $C_4H_9$ | — | $a_{15}$ | $a_{15}$ | — | $C_4H_9$ |
| 128 | $C_5H_{11}$ | — | $a_{15}$ | $a_{15}$ | — | $C_5H_{11}$ |
| 129 | $C_6H_{13}$ | — | $a_{15}$ | $a_{15}$ | — | $C_6H_{13}$ |
| 130 | $C_7H_{15}$ | — | $a_{15}$ | $a_{15}$ | — | $C_7H_{15}$ |
| 131 | $C_8H_{17}$ | — | $a_{15}$ | $a_{15}$ | — | $C_8H_{17}$ |
| 132 | $C_{12}H_{25}$ | — | $a_{15}$ | $a_{15}$ | — | $C_3H_7$ |
| 133 | H | — | $a_{15}$ | $a_{26}$ | O | $C_{16}H_{33}$ |
| 134 | $C_{10}H_{21}$ | — | $a_{15}$ | $a_{26}$ | — | $C_{10}H_{21}$ |
| 135 | $C_8H_{17}$ | — | $a_{16}$ | $a_{16}$ | — | $C_8H_{17}$ |
| 136 | $C_{18}H_{37}$ | — | $a_{16}$ | $a_{16}$ | — | $C_{18}H_{37}$ |
| 137 | $C_6H_{13}$ | — | $a_{16}$ | $a_{26}$ | — | $C_6H_{13}$ |
| 138 | $C_{11}H_{23}$ | — | $a_{16}$ | $a_{26}$ | O | $C_2H_5$ |
| 139 | $C_8H_{17}C≡C$ | O | $a_{17}$ | $a_{17}$ | — | $C_{10}H_{21}$ |
| 140 | $C_9H_{19}$ | — | $a_{17}$ | $a_{18}$ | O | $C_3H_7$ |

TABLE 12

| No. | R | X | A | B | X' | R' |
|---|---|---|---|---|---|---|
| 141 | $C_7H_{15}$ | — | $a_{17}$ | $a_{17}$ | — | $C_7H_{15}$ |
| 142 | $C_8H_{17}$ | — | $a_{17}$ | $a_{17}$ | — | $C_8H_{17}$ |
| 143 | $C_9H_{19}$ | — | $a_{17}$ | $a_{17}$ | — | $C_9H_{19}$ |
| 144 | $C_{10}H_{21}$ | — | $a_{17}$ | $a_{26}$ | — | $C_{10}H_{21}$ |
| 145 | $C_5H_{11}$ | — | $a_{18}$ | $a_{18}$ | — | $C_5H_{11}$ |
| 146 | $C_7H_{15}$ | — | $a_{18}$ | $a_{26}$ | O | $C_{12}H_{25}$ |
| 147 | $C_8H_{17}$ | — | $a_{19}$ | $a_{19}$ | — | $C_8H_{17}$ |
| 148 | $C_4H_9$ | — | $a_{19}$ | $a_{19}$ | — | $C_4H_9$ |
| 149 | $C_7H_{15}$ | — | $a_{19}$ | $a_{19}$ | — | $C_7H_{15}$ |
| 150 | $C_{10}H_{21}$ | — | $a_{19}$ | $a_{19}$ | — | $C_{10}H_{21}$ |
| 151 | $C_8H_{17}$ | — | $a_{19}$ | $a_{26}$ | O | $C_{10}H_{21}$ |
| 152 | $C_7H_{15}$ | — | $a_{19}$ | $a_{26}$ | — | $C_7H_{15}$ |
| 153 | $C_9H_{19}$ | — | $a_{20}$ | $a_{20}$ | — | $C_8H_{17}$ |
| 154 | $C_{12}H_{25}$ | — | $a_{20}$ | $a_{20}$ | — | $C_5H_{11}$ |
| 155 | $C_8H_{17}$ | — | $a_{21}$ | $a_{21}$ | — | $C_8H_{17}$ |
| 156 | $C_6H_{13}$ | O | $a_{21}$ | $a_{21}$ | — | $C_{11}H_{23}$ |
| 157 | $C_{10}H_{21}$ | — | $a_{21}$ | $a_{21}$ | O | $C_4H_9$ |
| 158 | $C_5H_{11}$ | — | $a_{21}$ | $a_{21}$ | — | $C_5H_{11}$ |
| 159 | $C_{11}H_{23}$ | — | $a_{21}$ | $a_{21}$ | — | $C_{11}H_{23}$ |
| 160 | $C_4H_9$ | — | $a_{21}$ | $a_{26}$ | O | $C_{12}H_{25}$ |

TABLE 13

| No. | R | X | A | B | X' | R' |
|---|---|---|---|---|---|---|
| 161 | $C_{19}H_{39}$ | — | $a_{21}$ | $a_{26}$ | — | H |
| 162 | $C_{13}H_{27}$ | — | $a_{22}$ | $a_{26}$ | — | $C_3H_7$ |
| 163 | $C_7H_{15}$ | — | $a_{22}$ | $a_{20}$ | — | $C_7H_{15}$ |
| 164 | $C_5H_{11}$ | — | $a_{23}$ | $a_{23}$ | — | $C_5H_{11}$ |
| 165 | $C_7H_{15}$ | — | $a_{23}$ | $a_{23}$ | — | $C_7H_{15}$ |
| 166 | $C_{10}H_{21}$ | — | $a_{23}$ | $a_{23}$ | — | $C_{10}H_{21}$ |
| 167 | $C_4H_9$ | — | $a_{23}$ | $a_{23}$ | — | $C_9H_{19}$ |
| 168 | $C_{12}H_{25}$ | — | $a_{23}$ | $a_{26}$ | O | $(CH_2)_7CH(CH_3)OC_2H_5$ |
| 169 | $C_3H_7$ | — | $a_{24}$ | $a_{24}$ | — | $C_3H_7$ |
| 170 | $C_6H_{13}$ | — | $a_{24}$ | $a_{24}$ | — | $C_6H_{13}$ |
| 171 | $C_7H_{15}$ | — | $a_{24}$ | $a_{24}$ | — | $C_7H_{15}$ |
| 172 | $C_8H_{17}$ | — | $a_{24}$ | $a_{24}$ | — | $C_8H_{17}$ |
| 173 | $C_{11}H_{23}$ | — | $a_{24}$ | $a_{24}$ | — | $C_{11}H_{23}$ |
| 174 | $C_9H_{19}$ | — | $a_{24}$ | $a_{26}$ | O | $C_5H_{11}$ |
| 175 | $C_6H_{13}$ | — | $a_{25}$ | $a_{24}$ | — | $C_4H_9$ |
| 176 | $C_{17}H_{35}$ | — | $a_{25}$ | $a_{25}$ | — | $C_{17}H_{35}$ |
| 177 | $C_7H_{15}$ | O | $a_{27}$ | $a_{27}$ | — | $C_7H_{15}$ |
| 178 | $C_8H_{17}$ | — | $a_{28}$ | $a_{26}$ | — | $C_5H_{11}$ |
| 179 | $CH_3$ | — | $a_{29}$ | $a_4$ | — | $C_{10}H_{21}$ |
| 180 | $C_9H_{19}$ | O | $a_{30}$ | $a_{30}$ | — | $C_{11}H_{23}$ |

TABLE 14

| No. | R | X | A | B | X' | R' |
|---|---|---|---|---|---|---|
| 181 | $C_4H_9$ | — | $a_{31}$ | $a_{25}$ | — | $C_{12}H_{25}$ |
| 182 | $C_{15}H_{31}$ | — | $a_{32}$ | $a_{26}$ | — | $C_{15}H_{31}$ |
| 183 | $C_8H_{17}$ | — | $a_1$ | $a_4$ | — | $C_8H_{17}$ |
| 184 | $C_5H_{11}$ | — | $a_1$ | $a_6$ | — | $C_5H_{11}$ |
| 185 | $C_{12}H_{25}$ | — | $a_1$ | $a_6$ | — | $C_{12}H_{25}$ |
| 186 | $C_7H_{15}$ | — | $a_1$ | $a_7$ | — | $C_7H_{15}$ |
| 187 | $C_5H_{11}$ | — | $a_1$ | $a_8$ | — | $C_{11}H_{23}$ |
| 188 | $C_9H_{19}$ | — | $a_1$ | $a_9$ | — | $C_9H_{19}$ |
| 189 | $C_6H_{13}$ | — | $a_1$ | $a_{10}$ | — | $C_6H_{13}$ |
| 190 | $C_4H_9$ | — | $a_1$ | $a_{14}$ | — | $C_4H_9$ |
| 191 | $C_7H_{15}$ | — | $a_1$ | $a_{16}$ | — | $C_7H_{15}$ |
| 192 | $C_{11}H_{23}$ | — | $a_1$ | $a_{18}$ | — | $C_{11}H_{23}$ |
| 193 | $C_8H_{17}$ | — | $a_1$ | $a_{25}$ | — | $C_9H_{19}$ |
| 194 | $C_5H_{11}$ | — | $a_3$ | $a_6$ | — | $C_3H_7$ |
| 195 | $C_{10}H_{21}$ | — | $a_7$ | $a_{10}$ | — | $C_3H_7$ |
| 196 | $C_6H_{13}$ | — | $a_7$ | $a_{22}$ | — | $C_6H_{13}$ |
| 197 | $C_7H_{15}$ | — | $a_{14}$ | $a_{18}$ | — | $C_{10}H_{21}$ |
| 198 | $C_4H_9$ | — | $a_{15}$ | $a_{25}$ | — | $C_4H_9$ |
| 199 | $C_6H_{13}$ | — | $a_1$ | $a_{25}$ | — | $C_5H_{11}$ |
| 200 | $C_8H_{17}$ | — | $a_{24}$ | $a_{26}$ | — | $C_8H_{17}$ |

TABLE 15

| No. | R | X | A | B | X' | R' |
|---|---|---|---|---|---|---|
| 201 | $C_2H_5OC_3H_6$ | — | $a_1$ | $a_1$ | — | $C_2H_5OC_3H_6$ |
| 202 | $C_3H_7OC_3H_6$ | — | $a_1$ | $a_1$ | — | $C_3H_7OC_3H_6$ |
| 203 | $C_4H_9OC_3H_6$ | — | $a_1$ | $a_1$ | — | $C_4H_9OC_3H_6$ |
| 204 | $(CH_3)_2CHCH_2CH_2CH_2$ | — | $a_1$ | $a_1$ | — | $CH_2CH_2CH_2CH(CH_3)_2$ |
| 205 | $(CH_3)_2CHCH_2CH_2CH_2CH_2$ | — | $a_1$ | $a_1$ | — | $CH_2CH_2CH_2CH_2CH(CH_3)_2$ |
| 206 | $CH_3CH_2\overset{\underset{\mid}{CH_3}}{C}HCH_2CH_2CH_2$ | — | $a_1$ | $a_1$ | — | $CH_2CH_2CH_2\overset{\underset{\mid}{CH_3}}{C}HCH_2CH_3$ |

In a preferred embodiment, the structural isomer mixture (comprising a plurality of organic compounds) used in the present invention may suitably be prepared by reacting two mono-substituted cyclic compounds (monomers) each having a plurality of reaction sites (positions) with each other or by effecting dimerization of one mono-substituted cyclic compound having a plurality of reaction sites.

The thus-prepared structural isomer mixture includes a major component (structural-isomer) and a minor component (structural isomer) in a (major component)/(minor component) ratio of 1/1 to 9/1, particularly 1/1 to 5/1.

In the electroconductive device of the present invention, the electroconductive layer comprising the above-mentioned structural isomer mixture is disposed between a pair of oppositely disposed electrodes, thus improving current and device characteristics. The electroconductive layer allows a high joint efficiency with metal and a high (carrier) mobility, so that the resultant electroconductive device is applicable to various semiconductor devices. The structure of the pair of electrodes may appropriately be changed depending on characteristics and structures of the semiconductor devices used.

In the EL device of the present invention, the electroconductive layer of structural isomer mixture is used as a carrier injection layer and/or a carrier transport layer, thus improving carrier injection and/or transport performances from the electrodes to ensure a good luminescent characteristic.

Figure 6:
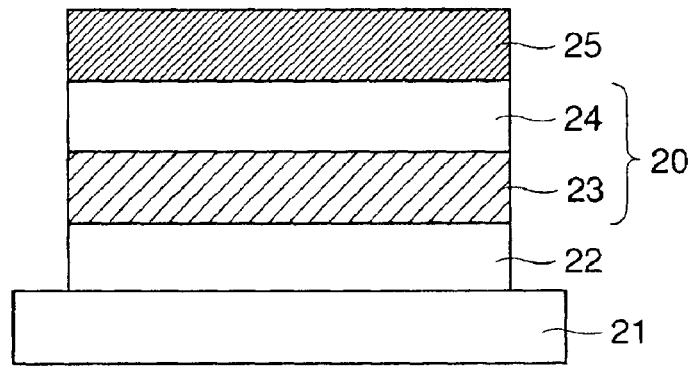
FIGS. 6 and 7 are respectively a schematic sectional view of an embodiment of an organic EL device.
Figure 7:
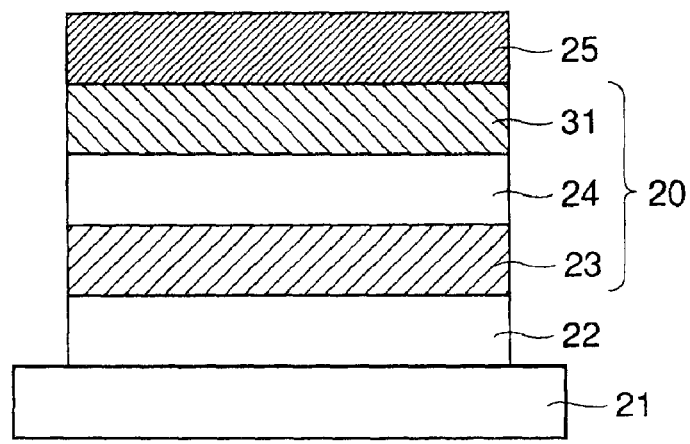

The EL device according to the present invention has a principal structure wherein a luminescence layer and the electroconductive layer of structural isomer mixture (as the carrier injection layer and/or the carrier transport layer as described above) are disposed between a pair of oppositely disposed electrodes as shown in FIGS. 6 and 7.

Referring to FIGS. 6 and 7, materials for the transparent substrate 21, anode (transparent electrode) 22, luminescence layer 24 and cathode (metal electrode) 25 may be known ones.

More specifically, the anode 22 may be formed of a transparent conductive material having a larger work function, preferably ITO (indium tin oxide) or IZO (indium zinc oxide). ITO may preferably contain 1–30 wt. % of $SnO_2$ per $In_2O_3$, and IZO may preferably contain 5–30 wt. % of ZnO per $In_2O_3$, so as to provide a lower electric resistance. The anode 22 may also be formed of other materials, such as indium oxide, tin oxide, $Cd_2SnO_4$, zinc oxide, copper iodide, gold and platinum.

The cathode 25 may be formed of a material (metal, alloy or compound) having a smaller work function by (vacuum) vapor deposition or sputtering. Examples of the material for the cathode 25 may include i metals, such as K, Li, Na, Mg, Ka, Ce, Ca, Cr and Ba; compounds, such as BaO, BaS, CaO, HfC, $LaB_6$ MgO, MoC, NbC, PbS and SiO; and alloys of Al—Ca (Ca=1–30 wt. %) and Al—Li (Li=0.5–10 wt. %), in order to improve stability.

The luminescence layer 24 may be formed of Alq 3 (tris(8-quinolinato)aluminum), BeBq (bis(benzoquinolinolato)beryllium complex), DTVBi (4,4'-bis-(2,2-di-p-tolyl-vinyl)-biphenyl), Eu $(DBM)_3$ (Phen) (tris(1, 3-diphenyl-1,3-propanediono) (mono-phenanthroline) Eu (III), diphenylethylene derivatives, triphenylamine derivatives, diaminocarbazole derivatives, bisstyryl derivatives, benzothiazole derivatives, benzoxazole derivatives, aromatic diamine derivatives, quinacridone compounds, perylene compounds, oxadiazole compounds, coumarin compounds, and anthraquinone compounds. These materials may preferably be formed in a layer in an amorphous state by vacuum (vapor) deposition.

The electroconductive layer formed of the above-mentioned structural isomer mixture is used as at least one layer of a hole transfer layer 23 (shown in FIGS. 6 and 7), an electron transport layer 31 (shown in FIGS. 6 and 7), a hole injection layer (not shown) and an electron injection layer (not shown). These carrier injection and transport layers other than the electroconductive layer may be formed of known materials.

In the EL device of the present invention, the electroconductive layer of a structural isomer mixture may particularly preferably be used as the electron injection layer. More specifically, in an ordinary EL device, it is generally difficult to effect injection of electrons from the cathode into the organic compound layer(s) compared with injection of holes from the anode into the organic compound layer(s). This may be attributable to difficulty of decreasing a work function of a metal (used for the metal (cathode) electrode) compared with LUMO level of the organic material used, due to lower stability of the metal material. Accordingly, in the EL device having such a structure that one or plural organic compound layers (films) are disposed between the cathode and the anode, the electroconductive layer of structural isomer mixture may effectively be used as the electron injection layer, thus allowing use of a material having a molecular structure with a high planarity (which cannot be conventionally used due to crystallization of its deposited film) to give more latitude in selection of material used.

The hole transport layer may be formed of an electron-donating material, such as triphenyldiamine derivatives (a representative example thereof may include α-NPD (bis[N-(1-naphthyl)-N-phenyl]benzidine) shown hereinafter). Examples of the hole injection layer material may include tetraarylbenzidine compounds (triphenyldiamine), hydrazone derivatives, carbazole derivatives, triazole derivatives, imidazole derivatives, oxadiazole derivatives and polythiophene.

In the case of forming the electron injection layer, a material therefor may include quinoline derivatives (such as Alq3 described above), oxadiazole derivatives and perylene derivatives.

Hereinbelow, the present invention will be described more specifically based on Examples.

EXAMPLE 1

Synthesis of Ex. Comp. No. 19

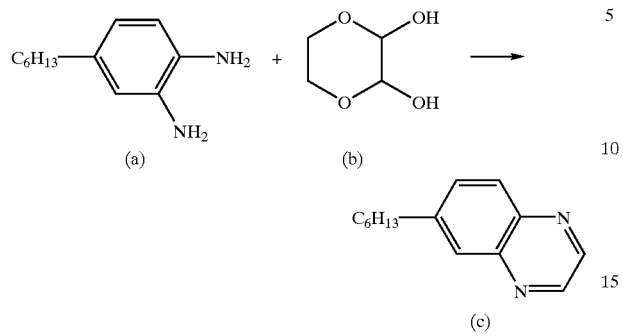

In a 2 liter-round bottomed flask, 64 g (371.1 mM) of 1,2-diamino-4-hexylbenzene (a) and 49.5 g (412.1 mM) of 1,4-dioxane-2,3-diol (b) were placed and dissolved in 793 ml of ethanol, followed by stirring overnight at room temperature.

After the reaction, the reaction mixture was subjected to distilling-off of the solvent under reduced pressure and purified by silica gel column chromatography (eluent: toluene/ethyl acetate=1/4), followed by distilling-off of the solvent under reduced pressure to obtain 53.3 g of 6-hexyl-quinoxaline (e).

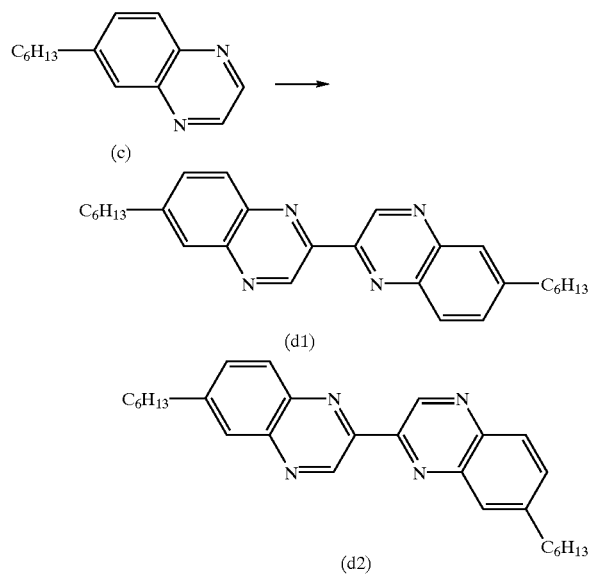

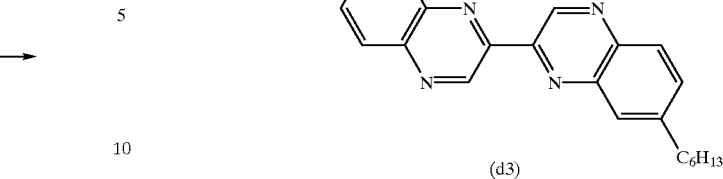

In a 200 ml-round bottomed flask, 53.3 g (248.7 mM) of 6-hexylquinoxaline (c), 31 g (258.8 mM) of pyridine-1-oxide and 20 g of palladium-carbon were placed and heat-refluxing overnight under stirring. After cooling, the reaction mixture was subjected to filtration, followed by distilling-off of the solvent under reduced pressure to obtain a residue. The residue was washed with ethanol and subjected to filtration, followed by recrystallization from pyridine to obtain a crude product. The crude product was dissolved in chloroform and filtered with alumina. The filtrate was recrystallized from toluene to obtain 10.4 g of structural isomer mixture (2,2'-bihexyl-quinoxaline ((d1)/(d2)/(d3)=1/2/1); Ex. Comp. No. 19).

The structural isomer mixture showed the following phase transition series.

Phase Transition Temperatures (° C.)

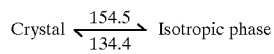

The above-prepared structural isomer mixture (Ex. Comp. No. 19) and two comparative compounds (Comparative Compounds 1 and 2) were evaluated in terms of crystallization characteristic in the following manner.

Each compound was formed in a 20 nm-thick film by vacuum (vapor) deposition and observed at 30° C., thus determining a time required to cause crystallization.

The results are shown in Table 16.

TABLE 16

| Ex. Comp. No. | Formula | Crystallization (Hr at 30° C.) |
|---|---|---|

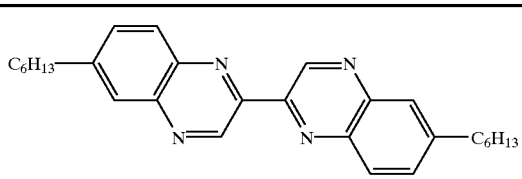

TABLE 16-continued

| Ex. Comp. No. | Formula | Crystallization (Hr at 30° C.) |
|---|---|---|
| 19 | [structure: C6H13-quinoxaline-quinoxaline-C6H13] | >72 |
| | [structure: C6H13-quinoxaline-quinoxaline-C6H13 isomer] | |
| Comparative compound 1 | [structure: C6H13-quinoline-quinoline-C6H13] | 12 |
| Comparative compound 2 | [structure: quinoline-quinoline] | 0 |

As shown in Table 16, compared with monomolecular compounds (Comparative Compounds 1 and 2), the structural isomer mixture (Ex. Comp. No. 19) provided a stable amorphous structure.

EXAMPLE 2

An organic EL device (electroconductive device) having a sectional structure as shown in FIG. 1 was prepared by using the structural isomer mixture (Ex. Comp. No. 19) prepared in Example 1 in the following manner.

On a 1 mm-thick glass substrate 11, a 70 nm-thick ITO (indium tin oxide) film was formed as an anode (ITO electrode) 12 by sputtering and ultraviolet-light irradiation for surface treatment (cleaning).

The above-treated substrate 11 having the ITO film (anode) 12 was placed in a vacuum chamber held at a pressure of ca. $1.33 \times 10^{-3}$ Pa (ca. $1 \times 10^{-5}$ Torr), and a 50 nm-thick layer of α-NPD (bis[N-(1-naphthyl)-N-phenyl]benzidine) represented by a formula shown below was formed on the ITO film 12 as a hole (carrier) transporting layer 13 by (resistance heating) vacuum deposition at a rate of 0.1 nm/sec.

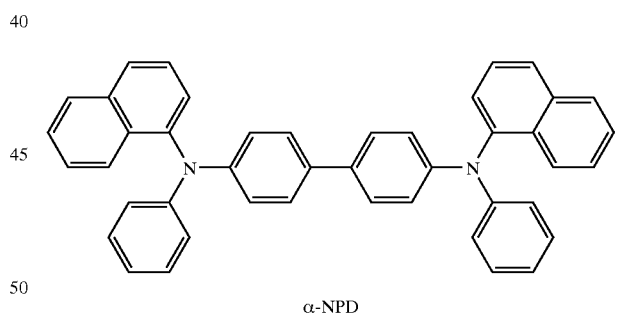

α-NPD

Under similar vacuum deposition conditions, three organic layer segments (luminescence layer segments) 14 exhibiting different luminescent wavelengths were respectively formed in a thickness of 50 nm on the hole transporting layer 13 by vacuum deposition. The three organic layer (luminescence layers) 14a–14c were respectively formed of (95 wt. % of) Alq3 of a formula (a) shown below doped with 5 wt. % of perylene of a formula (b) shown below for shifting the luminescence wavelength to a shorter wavelength side, (95 wt. % of) Alq3 of the formula (a) doped with 5 wt. % of DCM (a styryl dye) of a formula (c) shown below for shifting the luminescence wavelength to a longer wavelength side, and Alq3 alone (providing a center luminescence wavelength).

On each of the luminescence layers 14a–14c, a 20 nm-thick layer of a structural isomer mixture (Ex. Comp.

No. 19) was formed as an electron (carrier) injection layer 16 by vacuum deposition.

The thus-formed electron injection layer (structural isomer mixture layer) 16 was coated with a lamination-type cathode metal layer as a cathode electrode 15 each comprising a 10 nm-thick layer of Al—Li alloy (Al/Li=98.2/1.8 by weight) and a 150 nm-thick Al layer, respectively, formed by vacuum deposition to prepare an organic EL device as shown in FIG. 1.

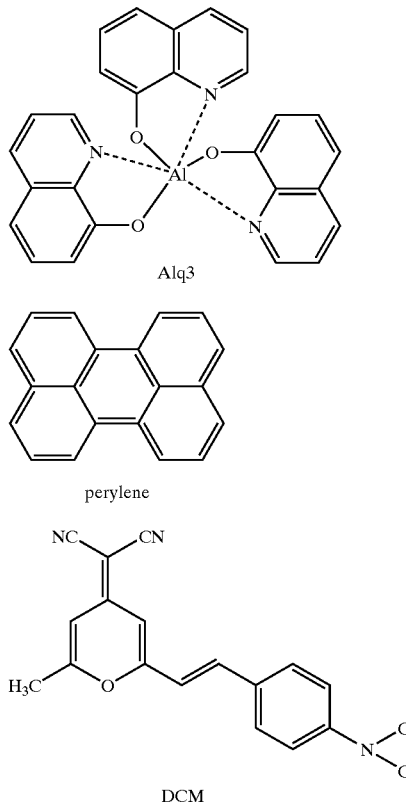

(a) Alq3

(b) perylene (c) DCM

The thus-prepared EL device was subjected to measurement of a current-voltage characteristic and a luminescence efficiency at room temperature at a portion containing the luminescence layer 14c comprising Alq3 alone (i.e., free from the dopants of the formulas (b) and (c)) by using a microammeter ("4140B", mfd. by Hewlett-Packard Co.) and a luminance meter ("BM7", mfd. by Topcon K.K.), respectively.

Figure 2:
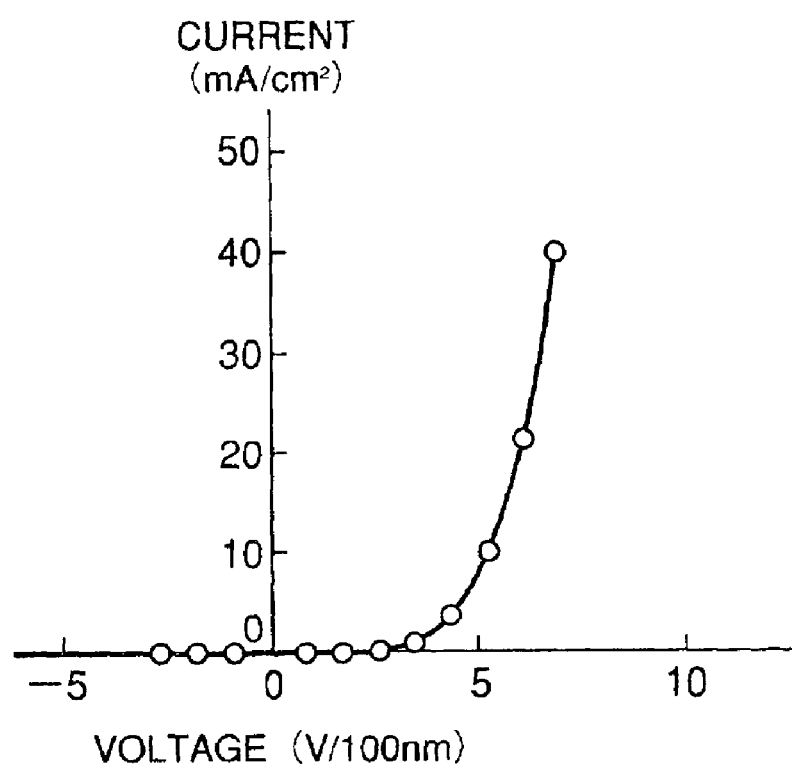
FIGS. 2 and 3 are respectively a graph showing a current (density)-voltage characteristic of an organic EL device prepared in Example 2 (FIG. 2) and Comparative Example 1 (FIG. 3), respectively.
Figure 4:
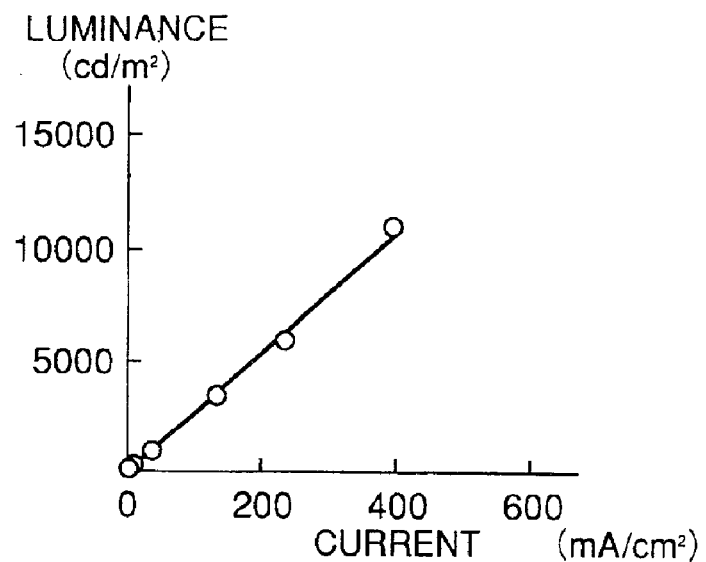
FIGS. 4 and 5 are respectively a graph showing a luminescence efficiency of an organic EL device prepared in Example 2 (FIG. 4) and Comparative Example 1 (FIG. 5), respectively.

The results are shown in FIGS. 2 and 4, respectively.

Referring to FIG. 2, the resultant current-voltage curve showed that the EL device provided a good rectifying performance and a higher current density with respect to an applied electric field. Further, as shown in FIG. 4, it was also confirmed that the EL device provided a higher luminescence efficiency in proportion to the current density.

The higher current density may be attributable to improvement in electron injection efficiency (performance) by the use of the structural isomer mixture (Ex. Comp. No. 19 in this example) since the EL device provided the higher current density compared with that in Comparative Example 1 below although the EL device had a lower electric field intensity.

Comparative Example 1

An organic EL device was prepared and evaluated in the same manner as in Example 2 except that the electron injection layer 16 (of the structural isomer mixture (Ex. Comp. No. 19) was not formed.

Figure 3:
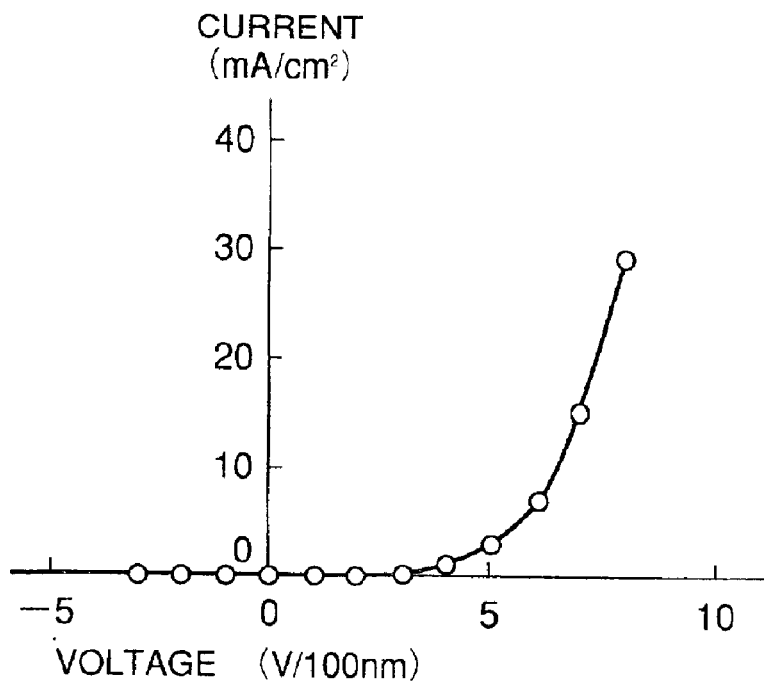
Figure 5:
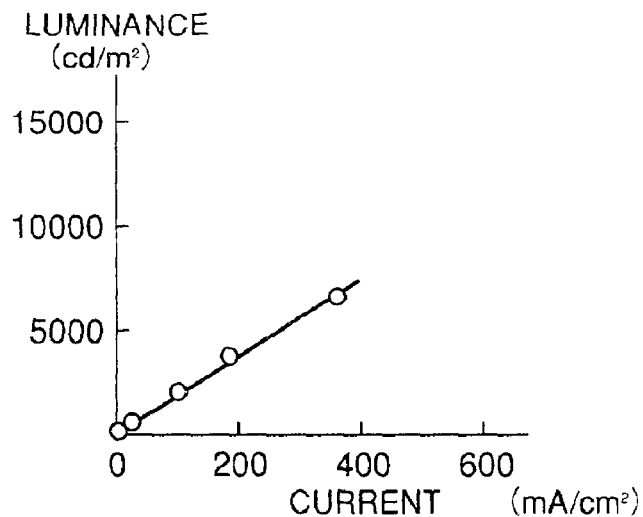

The results (current-voltage characteristic and luminescence efficiency) are shown in FIGS. 3 and 5, respectively.

Compared with FIG. 2 (Example 2), although a higher electric field strength (a smaller organic compound layer thickness) was applied, the EL device (of Comparative Example 1) provided smaller current density values as shown in FIG. 3, thus resulting in an inferior electron injection performance.

As described hereinabove, according to the present invention, by using the electroconductive layer formed of structural isomer mixture excellent in carrier injection and/or transport characteristics, it is possible to apply the resultant electroconductive device to various devices including semiconductor devices, thus improving their characteristics. Particularly, the organic EL device according to the present invention wherein the electroconductive layer is used as a carrier injection layer and/or a carrier transport layer provides improved luminescence efficiency and current-voltage characteristic, so that it is also possible to employ a thicker organic compound layer thereby to improve reliability (e.g., prevention of occurrence of short-circuit between a pair of electrodes).

What is claimed is:

1. An electroconductive device, comprising:

a pair of oppositely disposed electrodes, and a luminescence layer and an electroconductive layer disposed between the electrodes, wherein the electroconductive layer comprises a mixture of a plurality of organic compounds which are mutually intermolecularly structural isomers having an identical ring structure and an identical rational formula but having structures different in the manner in which their atoms are linked, and said plurality of organic compounds include a major component and a minor component, the mixture comprising the major and minor components in a (major component)/(minor component) ratio of 1/1 to 9/1, and wherein the organic compounds are represented by the following formula (1):

$$(R-X)_n-Ar-(X'-R')_m \qquad (1),$$

wherein Ar denotes a connected ring structure comprising two single rings connected with each other via a single bond or two fused rings connected with each other via a single bond; X and X' independently denote a single bond, —O—, —S—, —OOC— or —COO—; R and R' independently denote —H, —F or a linear or branched alkyl group having 1–20 carbon atoms capable of including one methylene group which can be replaced with —O—, —S—, —CH=CH— or —C≡C; and m and n are an integer of 1–8, with the proviso that R and R' cannot be —H at the same time when X and X' are a single bond.

2. A device according to claim 1, wherein Ar in the formula (1) is a connecting ring structure comprising two fused rings connected with each other via a single bond, each of said two fused rings comprising 2–5 rings.

3. A device according to claim 2, wherein Ar in the formula (1) is a connected ring structure represented by any one of the following formulas (a) to (n):

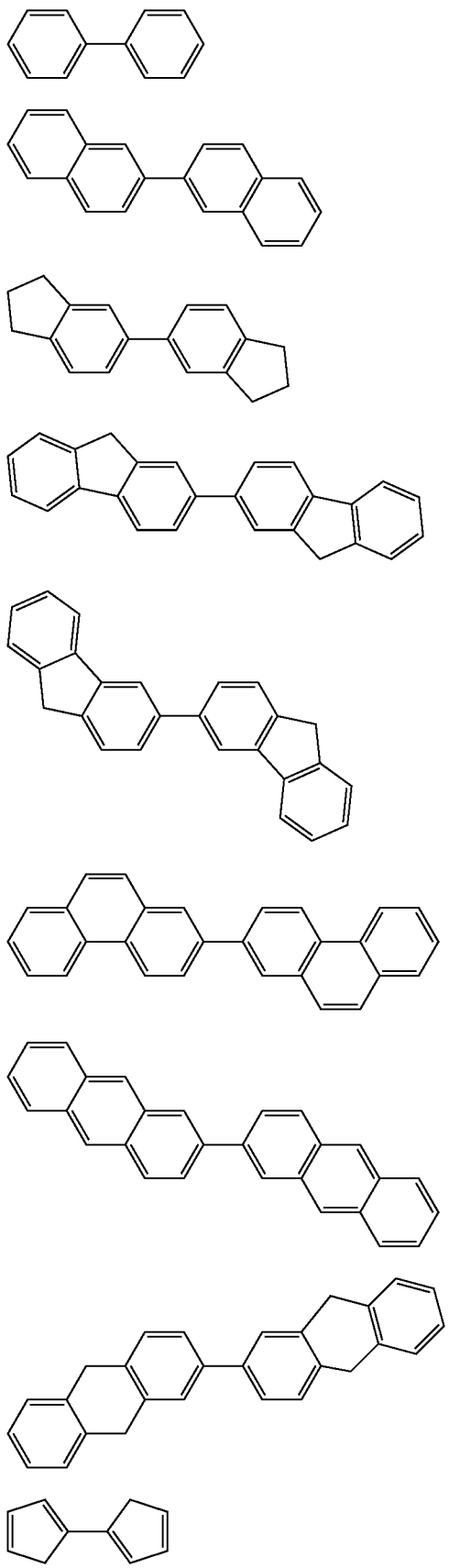

wherein CH is optionally substituted with N or NH, and CH$_2$ is optionally substituted with S or O.

4. A device according to claim 1, wherein Ar in the formula (1) is a connecting ring structure represented by the following formula (2):

A—B                                    (2), wherein A and B independently denote any one of phenyl-diyl, pyridine-diyl, pyrazine-diyl, pyrimidine-diyl, pyridazine-diyl, indene-diyl, indolizine-diyl, isoindole-diyl, indole-diyl, purine-diyl, naphthalene-diyl, quinoline-diyl, isoquinoline-diyl, quinoxaline-diyl, 1,5-naphthyridine-diyl, 1,6-naphthyridine-diyl, 1,7-naphtharidine-diyl, 1,8-naphthyridine-diyl, quinazoline-diyl, cinnoline-diyl, pyrido[2,3-b]pyrazine-diyl, pyrazino[2, 3]b]pyrazine-diyl, pteridine-diyl, biphenylene-diyl, fluorene-diyl, carbazole-diyl, thianthrene-diyl, phenalene-diyl, phenanthridine-diyl, phenanthrene-diyl, anthracene-diyl, chrysene-diyl, acridine-diyl, perimidine-diyl, phenanthroline-diyl, phenazine-diyl, phenothiazine-diyl, phenoxathin-diyl, indan-diyl, coumaran-diyl, phthalan-diyl, chroman-diyl, isochroman-diyl, thiachroman-diyl, isothiachroman-diyl, and thiaxanthene-diyl.

5. A device according to claim 4, wherein A in the formula (2) is quinoxaline-diyl.

6. A device according to claim 1, wherein R=R', X=X7 and m=n=1 are satisfied in the formula (1), and A=B is satisfied in the formula (2) to form a symmetric structure having a center of symmetry.

7. A device according to claim 1, wherein the mixture of a plurality of organic compounds is in an amorphous state.

8. An electroluminescence device, comprising:

a pair of oppositely disposed electrodes, and a luminescence layer and a carrier injection layer and/or a carrier transport layer disposed between the electrodes, wherein the carrier injection layer and/or the carrier transport layer comprises the electroconductive layer of the electroconductive device according to claim 1.

9. A device according to claim 8, wherein the device comprises the luminescence layer and the carrier injection layer disposed between the electrodes, the carrier injection layer being an electron injection layer.

* * * * *